United States Patent [19]
Hübner

[11] Patent Number: 5,830,803
[45] Date of Patent: Nov. 3, 1998

[54] METHOD FOR FILLING CONTACT HOLES USING A DOCTOR BLADE

[75] Inventor: Holger Hübner, Baldham, Germany

[73] Assignee: Siemens Aktiengesellschaft, Munich, Germany

[21] Appl. No.: 669,508
[22] PCT Filed: Jan. 3, 1995
[86] PCT No.: PCT/DE95/00009
§ 371 Date: Jul. 10, 1996
§ 102(e) Date: Jul. 10, 1996
[87] PCT Pub. No.: WO95/19045
PCT Pub. Date: Jul. 13, 1995

[30] Foreign Application Priority Data

Jan. 11, 1994 [DE] Germany .......................... 44 00 532.6

[51] Int. Cl.$^6$ .................................................. H01L 21/44
[52] U.S. Cl. .......................... 438/613; 438/667; 438/654; 438/687
[58] Field of Search ................................. 438/613, 667, 438/654, 687

[56] References Cited

U.S. PATENT DOCUMENTS

| | | | |
|---|---|---|---|
| 5,468,681 | 11/1995 | Pasch | 438/108 |
| 5,547,530 | 8/1996 | Nakamura et al. | 438/613 |
| 5,587,342 | 12/1996 | Lin et al. | 438/613 |

FOREIGN PATENT DOCUMENTS

| | | |
|---|---|---|
| 0435187 | 7/1991 | European Pat. Off. . |
| 0610709 | 8/1994 | European Pat. Off. . |
| 2644011 | 9/1990 | France . |
| 04-105353 | 4/1992 | Japan . |
| WO 92/14260 | 8/1992 | WIPO . |

OTHER PUBLICATIONS

Patent Abstracts of Japan (E–1235), Jul. 16, 1992, No. 326, Manufacture of Semiconductor Device, Matsuchita Electric Ind Co Ltd., M. Nakatani, JP 4–97530 (30 Mar. 1992).
Patent Abstracts of Japan (E–867), Dec. 27, 1989, No. 594, Method of Filling Through–Hole With Conductor Paste, Hitachi Ltd. K. Takashi et al., JP 12–48592 (04 Oct. 1989).

*Primary Examiner*—Charles L. Bowers, Jr.
*Assistant Examiner*—Lynne A. Gurley
*Attorney, Agent, or Firm*—Hill, Steadman & Simpson

[57] ABSTRACT

The method produces liquid contacts in contact holes on a top side of a semiconductor component. The top side is not wettable by material provided for the liquid contacts. The walls and edges of the contact holes are wettable by the material. The contact holes are filled as follows. The material provided for the liquid contacts is applied to the top side by a doctor blade. There is situated on a longitudinal edge of the doctor blade an adhesion strip which is made of a material which is wettable by the material provided for the liquid contacts. The longitudinal edge of the doctor blade is guided at a distance over the top side. The material provided for the liquid contacts is moved in the form of a cylinder between the adhesion stip and the surface of the component.

7 Claims, 3 Drawing Sheets

METHOD FOR FILLING CONTACT HOLES USING A DOCTOR BLADE

BACKGROUND OF THE INVENTION

The present invention relates to a method for filling contact holes in the top side of a semiconductor component.

German Patent Application P 43 04 119 describes a component which is composed of a stack of circuit planes which are arranged one above the other and are connected to contacts. The vertical contacts between the circuit planes are realized by pouring a liquid metal, for example gallium, into prefabricated holes which are lined with a solid metal layer. The two metals alloy together and form a permanent connection, which forms the electrical and mechanical contact. Shortly before the application of the liquid metal, the surface of such a circuit plane provided with contact holes is predominantly composed of a polyimide layer, which cannot be wetted by the metal and in which the contact holes, which have a size of a few micrometers, are situated. The walls of the contact holes are provided with a metal layer (for example nickel or copper when using gallium for the liquid metal) which can be wetted by the liquid metal. The liquid metal is intended to be introduced into the contact holes in such a way that the latter are then completely filled and the surface of the polyimide layer remains dry. Small menisci of the liquid metal are intended to be formed in each case above the contact holes, which menisci project above the surface to a level which is sufficient for the intended application. The formation of the menisci must take place in a highly constant manner over the entire surface, it being intended, in addition, to achieve good reproducibility from wafer to wafer. In addition, it is necessary reliably to prevent residues of the liquid metal from adhering to the polyimide surface and possibly leading to a short circuit when the circuit planes are joined together. It is possible, for example, as described in the patent application specified, to pour the liquid metal on and subsequently peel off the drops which have formed on the surface over the non-wettable polyimide surfaces by means of a rotary movement of the wafer. In this case, the situation may arise where, even after the excess liquid metal has been hurled off, the contact holes, which are very small and are arranged very close together, remain electrically conductively connected, at least in individual cases, on the surface due to webs of the liquid metal. Drops of the liquid metal can adhere to those points at which the polyimide layer is not perfect, for example steps or cracks, and can lead to short circuits if they are pressed into the thin gap between the planes when the circuit planes are joined together.

SUMMARY OF THE INVENTION

The object of the present invention is to specify a method for filling contact holes in the top side of semiconductor components with a liquid metal in which the abovementioned difficulties do not occur.

In general terms the present invention is a method for producing liquid contacts in contact holes on a top side of a semiconductor component. The top side is not wettable by the material provided for the liquid contacts. The walls and edges of the contact holes are wettable by this material. The contact holes are filled such that the material provided for the liquid contacts is applied to the top side by means of a doctor blade. There is situated on a longitudinal edge of the doctor blade an adhesion strip which is made of material which is wetted by the material provided for the liquid contacts. The doctor blade is moved here by the longitudianal edge at a distance over the top side. The material provided for the liquid contacts is moved in the form of a cylinder between the adhesion strip and the surface of the component.

Advantageous developments of the present invention are as follows.

A doctor blade is utilized whose adhesion strip has, on both side surfaces of the doctor blade, strips adjoining the longitudinal edge which is moved over the top side of the component.

Prior to the application of the material provided for the liquid contacts, the top side of the component is covered between the contact holes with a passivating layer. The passivating layer is not wetted by the material provided for the liquid contacts.

Gallium is used for the liquid contacts and $SiO_2$ is used for the adhesion strip.

Prior to the application of the material provided for the liquid contacts, the wall and the edge of the contact holes are covered with a metallization layer, which is wetted by the material provided for the liquid contacts. Gallium is used for the liquid contacts and copper is used for the metallization layers.

A doctor blade is utilized which is provided, in a region outside the adhesion strip, with a channel system for receiving additional material provided for the liquid contacts.

In the method according to the invention, the liquid metal is applied using a doctor blade, similar to that used in screen printing. Such a doctor blade is a wide, thin strip, for example made of metal, similar to a knife blade with straight parallel edges. By applying a longitudinal edge of this doctor blade, the liquid metal can be distributed over the surface of the component. The essential feature in the method according to the invention is that the doctor blade is moved at a certain small distance over the surface of the component. The liquid metal, which is referred to below in a representative manner as gallium, is in this case moved in the shape of a cylinder between the surface and the edge and, if appropriate, the lower side areas of the doctor blade. The physical conditions on a curved surface of a liquid have a role to play. The surface of a liquid is formed in such a way that it has at all points the curvature defined by the internal pressure. The pressure at one point in the surface of the liquid is proportional to the sum of the reciprocal values of the two main radii of curvature of the surface at this point. When there are large drops of liquid on a surface, the hydrostatic pressure must also be taken into account. At the edges where the liquid comes into contact with the planar surface of the substrate, the tangential plane to the liquid surface forms an angle with the substrate which is 0 to 90° in the case of a non-wettable substrate and 90° to 180° in the case of a wettable substrate, the angle being measured outside the liquid.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
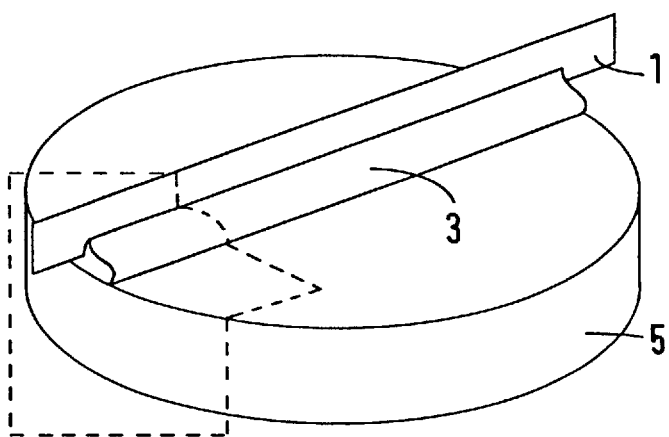
FIG. 1 shows the application of the doctor blade when carrying out the method.

As illustrated in FIG. 1, the doctor blade 1 has a length which projects somewhat beyond the diameter of the semiconductor wafer 5. At its lower longitudinal edge, it is composed of a material which is wetted by the gallium without alloying with it, such as aluminum or $SiO_2$, for example. The gallium 3 therefore hangs down from the lower longitudinal edge of the doctor blade 1 in the form of a cylinder having a drop-shaped cross section. In order to fill the contact holes, the doctor blade is guided at a distance above the surface of the component 5, but without touching the latter, such that the gallium cylinder comes into contact with the surface of the component 5. As they are swept over, the contact holes are filled by the gallium, because the walls and edges of the contact holes are coated with a material which is wetted by the gallium.

Figure 2:
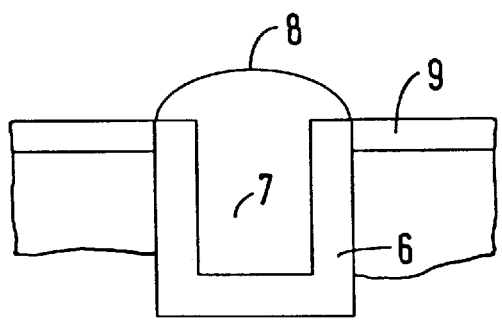
FIG. 2 shows a cross section of a contact hole filled with the gallium.

FIG. 2 shows a cross section of a filled contact hole. The wall is covered with a metallization layer 6, which may, for example, be nickel or copper if the material of the liquid contact 7 that is filled in is gallium. The surface regions adjoining the contact hole are covered with a passivating layer 9, which is not wetted by the gallium. This passivating layer 9 may be polyimide, for example. That portion of the liquid contact 7 which projects beyond the surface forms a meniscus 8. The height of the meniscus 8 correlates with the pressure level in the gallium cylinder during filling of the contact holes. This correlation will now be explained with reference to FIGS. 3 to 5.

Figure 3:
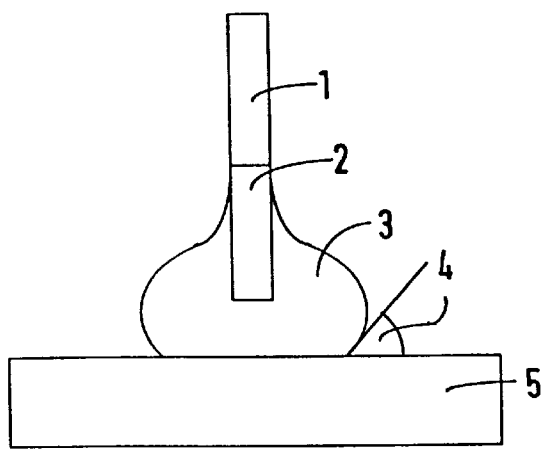
FIGS. 3 to 5 show, in cross section, the component and the doctor blade in different applications of the method.
Figure 4:
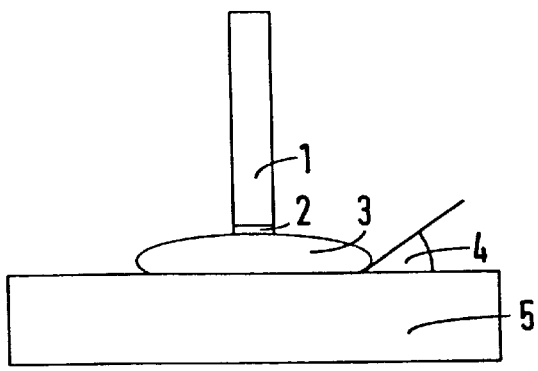

FIG. 3 shows the doctor blade 1 with the adhesion strip 2 which is present on the lower longitudinal edge and is made of material which is wetted by the gallium 3. FIG. 3 shows the doctor blade 1 at a point above the passivating layer on the top side of the component 5, so that the gallium 3 does not wet this top side at that point. The angle 4 between the free top side of the component 5 and the tangential plane to the surface of the gallium cylinder, at the bottom end thereof, is therefore less than 90°. The gallium cylinder acquires a drop-shaped cross section which is translationally invariant in the longitudinal direction of the doctor blade. In the arrangement of FIG. 4, the distance between the doctor blade 1 and the top side of the component 5 is distinctly smaller. In addition, the adhesion strip 2 on the lower edge of the doctor blade 1 is limited. The gallium therefore does not wet the side areas of the doctor blade 1 and is compressed in the manner shown in FIG. 4. The angle 4 between the free top side of the component 5 and the tangential plane to the surface of the gallium 3 at the edge of the interface between the gallium 3 and the component 5 is therefore less than the relevant angle in the arrangement of FIG. 3.

Figure 5:
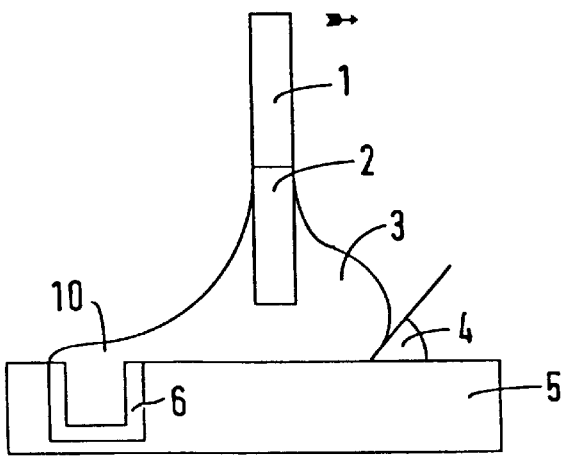
Figure 6:
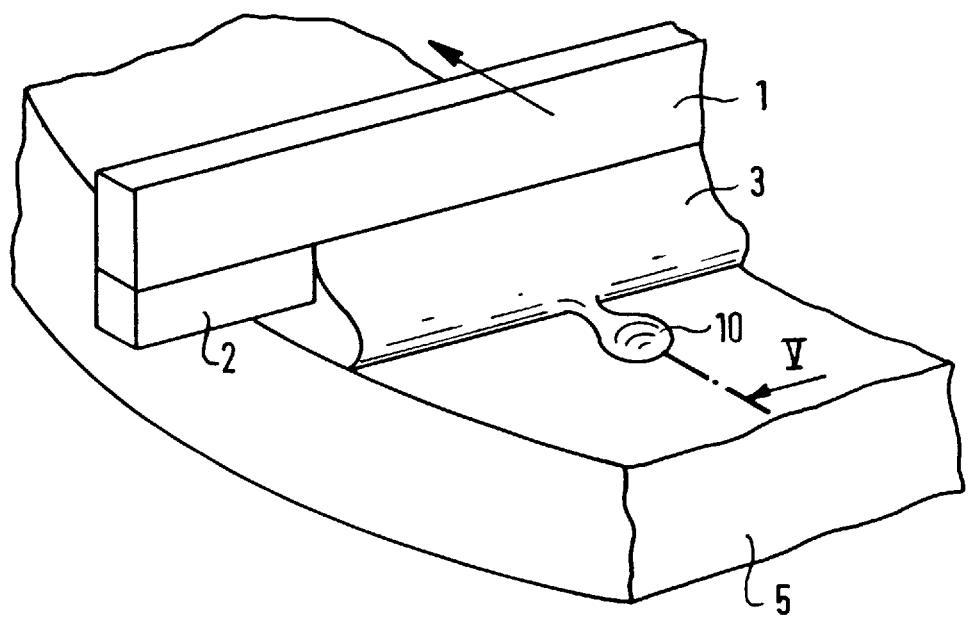
FIG. 6 shows an enlarged view of the detail illustrated by dashed lines in FIG. 1.

When it is over the non-wettable passivating layer, the cylinder of gallium 3 assumes, at least in principle, the form shown in FIGS. 3 and 4. If the doctor blade is situated above a contact hole, the gallium has approximately the same form, because the diameter of the contact hole is small in comparison with the width of the gallium cylinder. On a wettable surface, the gallium 3 would escape laterally with respect to the doctor blade, with the result that the angle 4 shown in FIGS. 3 and 4 would be greater than 90°. Escape of the cylinder produces a similar result over the contact holes when the doctor blade is moved further over the hole. FIG. 5 shows a cross section of the component 5 with a contact hole. The walls of the contact hole are provided with the metallization layer 6. The gallium wets this metallization layer and fills the contact hole when the gallium cylinder is moved by the doctor blade over the hole. The arrow shown in FIG. 5 indicates the direction of movement of the doctor blade. When the contact hole emerges behind the gallium cylinder, then a gallium thread 10 drags along behind the gallium 3 from the location of the contact hole. Since the gallium is wetted in the region of the contact hole, the angle formed by the free surface of the component 5 and the tangential plane to the surface of this gallium thread 10, at the boundary of the contact area between the gallium thread 10 and the metallization layer 6 of the contact hole, is greater than 90°. The gallium thread 10 is drawn out from the remaining gallium 3 until the gallium cylinder is so far away from the contact hole that the gallium between the contact hole and the cylinder constricts and, finally, a separate portion of the gallium remains as the contact hole filling. The surface of this filling forms the meniscus 8 shown in FIG. 2. This sequence of events is illustrated in FIG. 6, which shows an enlarged plan view approximately of the detail drawn using dashed lines in FIG. 1. The position of the section shown in FIG. 5 is shown in FIG. 6. This FIG. 6 again shows the doctor blade 1, the adhesion strip 2, the cylinder of liquid metal 3 and the component 5. The liquid metal thread 10 which is drawn out from the cylinder is additionally illustrated here. The gallium constricts between the approximately circular (in perpendicular plan view) portion, situated over the contact hole, of this thread 10 and the gallium cylinder. When the distance between the contact hole and the doctor blade becomes larger, this constriction becomes increasingly narrower, until the connection between the gallium cylinder and the contact hole filling breaks off completely. The contact hole is then filled and the entire adjoining wettable area (upper edge of the metallization layer 6) is wetted. The separation of the gallium thread can be explained by virtue of the fact that the radius of curvature of the thread 10 over the contact hole initially corresponds approximately to the radius of the contact hole and is thus substantially less than the radius of the curvature of the gallium cylinder. Consequently, the pressure in the thread is significantly higher than in the cylinder under the doctor blade. As a result, gallium is pressed back into the cylinder until the radius of curvature over the contact hole corresponds to the radius of curvature of the cylinder. When the doctor blade is moved away from the contact hole, the thread is separated from the side and leaves behind a neatly filled contact hole with a shallow meniscus, which can be exactly reproduced in a simple manner.

The same physical mechanism prevents too much liquid metal from remaining at points of small inhomogeneities in the non-wettable polyimide surface; this is because the smaller these points are, the smaller are the local radii of curvature of the liquid surface and the greater is the local pressure which propels the liquid back into the cylinder and prevents liquid metal from escaping into the inhomogeneities. In order to be able to guarantee conditions which are as uniform as possible, the volume in the cylinder at the lower longitudinal edge of the doctor blade must be large in comparison with the total volume of the contact holes to be filled. Should a single dipping of the doctor blade into a liquid metal supply prior to the coating of the wafer not suffice to form a sufficiently large cylinder at the lower edge of the doctor blade, then the doctor blade can be connected to a gallium reservoir, for example via capillary channels. As an alternative, use can be made of a doctor blade which is provided, on its side facing away from the adhesion strip, with a channel system (for example a rough coating or a capillary system) which can take up enough gallium and discharge it during the filling of the contact holes to ensure that the gallium cylinder always has a sufficient volume.

The height of the resulting meniscus 8 of the contact hole filling depends on the distance at which the doctor blade is moved above the top side of the component. On its two sides adjoining the bearing surface of the cylinder on the top side of the component, the gallium cylinder forms approximately a segment of an outer surface of a cylinder. The reciprocal value of one main radius of curvature is therefore 0. The meniscus of the contact hole filling is a spherical cap, with the result that the two main radii of curvature are identical. The result of the identity of the internal pressures, corresponding to the two surface forms, in the liquids is, therefore, that the radius of curvature of the miniscus over a cylindrical contact hole is approximately twice the radius of curvature at the edge of the bearing surface of the gallium cylinder. In the case of gallium having a density of 5907 kg/m$^3$ and a surface tension of 0.718 N/m, the radius of curvature of the gallium cylinder is a few millimeters, if the doctor blade is guided at a distance of 1 mm from the surface of the component. If a radius of curvature of 2 mm is assumed for the meniscus, the latter projects beyond a contact hole having a diameter of 5 μm only by 1.56 nm. It is therefore possible to fill the contact holes with a virtually planar closure. This is important if it is desired, when the circuit planes are joined together, to prevent gallium from being pressed into the gap between the circuit planes, which may lead to short circuits.

On the other hand, if the doctor blade 1 is brought to a distance of less than 10 μm away from the surface of the component and at the same time the side areas of the doctor blade are prevented from being wetted (as illustrated in FIG. 4), then the cylinder is pressed and at the surfaces which limit the cylinder in the direction of movement, a radius of curvature is obtained which corresponds to half the distance between the doctor blade and the component. The pressure in the liquid rises accordingly, and the radius of curvature of the menisci over the contact holes decreases. Given the specified diameter of 5 μm for the contact holes, it is thus possible to establish meniscus heights down to the μm range in a reproducible manner. The liquid contacts then project to a relatively large extent beyond the surface, which is desirable, for example, in order to compensate for ripples in the surface of the further circuit plane with which contact is to be made. This is advantageous, for example, particularly in the case of reversible contact-making for test purposes. In principle, any electrically conducting liquid can be used for filling the contact holes. A liquid metal such as the aforementioned gallium is particularly advantageous.

The invention is not limited to the particular details of the method depicted and other modification and applications are contemplated. Certain other changes may be made in the above described method without departing fron the true spirit and scope of the invention herein involved. It is intended, therefore, that the subject matter in the above depiction shall be interpreted as illustrative and not in a limiting sense.

I claim:

1. A method for producing liquid contacts in contact holes on a top side of a semiconductor component, said top side not being wettable by a material provided for said liquid contacts, and the walls and edges of said contact holes being wettable by said material, comprising the steps of:

applying said material for the liquid contacts to said top side utilizing a doctor blade said doctor blade having on a longitudinal edge thereof an adhesion strip wettable by the material provided for the liquid contacts;

moving said longitudinal edge of said doctor blade a distance over said top side; and moving the material provided for the liquid contacts in the form of a cylinder between said adhesion strip and the top side of the component.

2. The method as claimed in claim 1, wherein said adhesion strip has, on both side surfaces of the doctor blade, strips adjoining the longitudinal edge which is moved over the top side of the component.

3. The method as claimed in claim 1, wherein the method further comprises, prior to the application of the material provided for the liquid contacts, covering the top side of the component between the contact holes with a passivating layer, which is not wettable by the material provided for the liquid contacts.

4. The method as claimed in claim 1, wherein gallium is used for the liquid contacts and SiO$_2$ is used for the adhesion strip.

5. The method as claimed in claim 1, wherein the contact holes have walls and edges and, wherein the method further comprises, prior to the application of the material provided for the liquid contacts, covering the wall and the edge of the contact holes with a metallization layer, which is wettable by the material provided for the liquid contacts.

6. The method as claimed in claim 5, wherein gallium is used for the liquid contacts and copper is used for the metallization layers.

7. The method as claimed in claim 1, wherein said doctor blade, in a region outside the adhesion strip, has a channel system for receiving additional material provided for the liquid contacts.

\* \* \* \* \*